(12) United States Patent
Teh et al.

(10) Patent No.: US 9,852,918 B2
(45) Date of Patent: Dec. 26, 2017

(54) EMBEDDING ADDITIVE PARTICLES IN ENCAPSULANT OF ELECTRONIC DEVICE

(71) Applicant: Infineon Technologies AG, Neubiberg (DE)

(72) Inventors: Peh Hean Teh, Melaka (MY); Jagen Krishnan, Muar (MY); Swee Kah Lee, Melaka (MY); Poh Cheng Lim, Melaka (MY); Joachim Mahler, Regensburg (DE); Chew Theng Tai, Melaka (MY); Yik Yee Tan, Melaka (MY); Soon Lock Goh, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/835,750

(22) Filed: Aug. 26, 2015

(65) Prior Publication Data
US 2016/0064298 A1 Mar. 3, 2016

(30) Foreign Application Priority Data
Aug. 28, 2014 (DE) .......................... 10 2014 112 406

(51) Int. Cl.
| | | |
|---|---|---|
| *H01L 23/29* | (2006.01) | |
| *H01L 21/3105* | (2006.01) | |
| *H01L 21/56* | (2006.01) | |
| *H01L 23/00* | (2006.01) | |
| *H01L 23/31* | (2006.01) | |
| *H01L 23/495* | (2006.01) | |
| *C09J 163/00* | (2006.01) | |

(52) U.S. Cl.
CPC ........ *H01L 21/3105* (2013.01); *C09J 163/00* (2013.01); *H01L 21/56* (2013.01); *H01L 23/295* (2013.01); *H01L 23/3142* (2013.01); *H01L 23/3107* (2013.01); *H01L 23/49513* (2013.01); *H01L 23/49548* (2013.01); *H01L 23/49555* (2013.01); *H01L 2224/32245* (2013.01); *H01L 2224/48091* (2013.01); *H01L 2224/48247* (2013.01); *H01L 2224/73265* (2013.01); *H01L 2224/8392* (2013.01); *H01L 2224/8592* (2013.01); *H01L 2224/92247* (2013.01); *H01L 2924/181* (2013.01)

(58) Field of Classification Search
None
See application file for complete search history.

(56) References Cited

U.S. PATENT DOCUMENTS

2006/0071357 A1* 4/2006 Pilon .................... A61K 9/5089
264/4
2007/0001319 A1* 1/2007 Bauer ................. H01L 23/3142
257/783

(Continued)

FOREIGN PATENT DOCUMENTS

| CN | 102459027 A | 5/2012 |
|---|---|---|
| DE | 102008019407 A1 | 11/2008 |

*Primary Examiner* — Khaja Ahmad

(57) ABSTRACT

An electronic device comprising a carrier having a mounting surface, at least one electronic chip mounted on the mounting surface, an encapsulant at least partially encapsulating the carrier and the at least one electronic chip, and a plurality of capsules in the encapsulant, wherein the capsules comprise a core comprising an additive and comprise a shell, in particular a crackable shell, enclosing the core.

22 Claims, 6 Drawing Sheets

(56) References Cited

U.S. PATENT DOCUMENTS

| | | | |
|---|---|---|---|
| 2007/0145606 A1* | 6/2007 | Mahler | H01L 23/296 257/783 |
| 2008/0251904 A1* | 10/2008 | Theuss | H01L 21/563 257/679 |
| 2011/0220401 A1 | 9/2011 | Ying et al. | |
| 2012/0073655 A1* | 3/2012 | Mori | H01L 21/67363 136/259 |

* cited by examiner

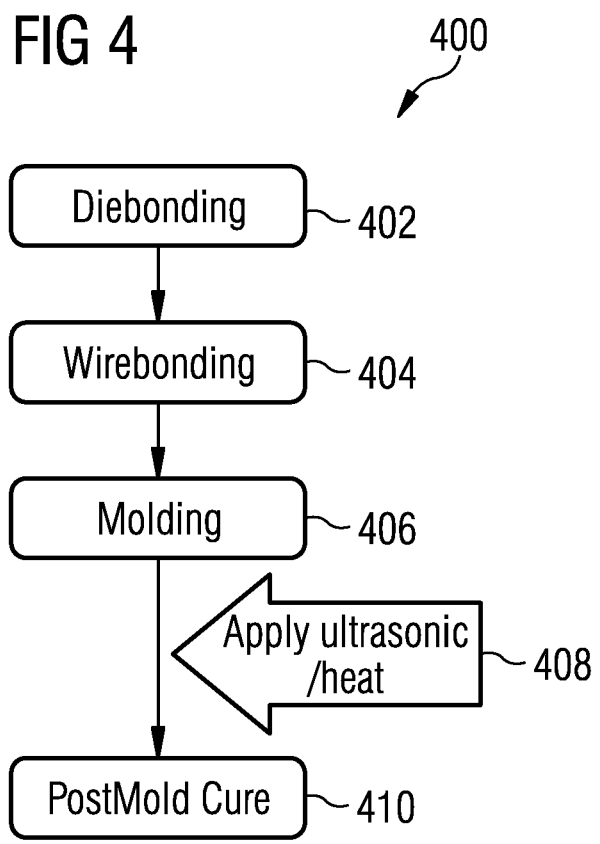

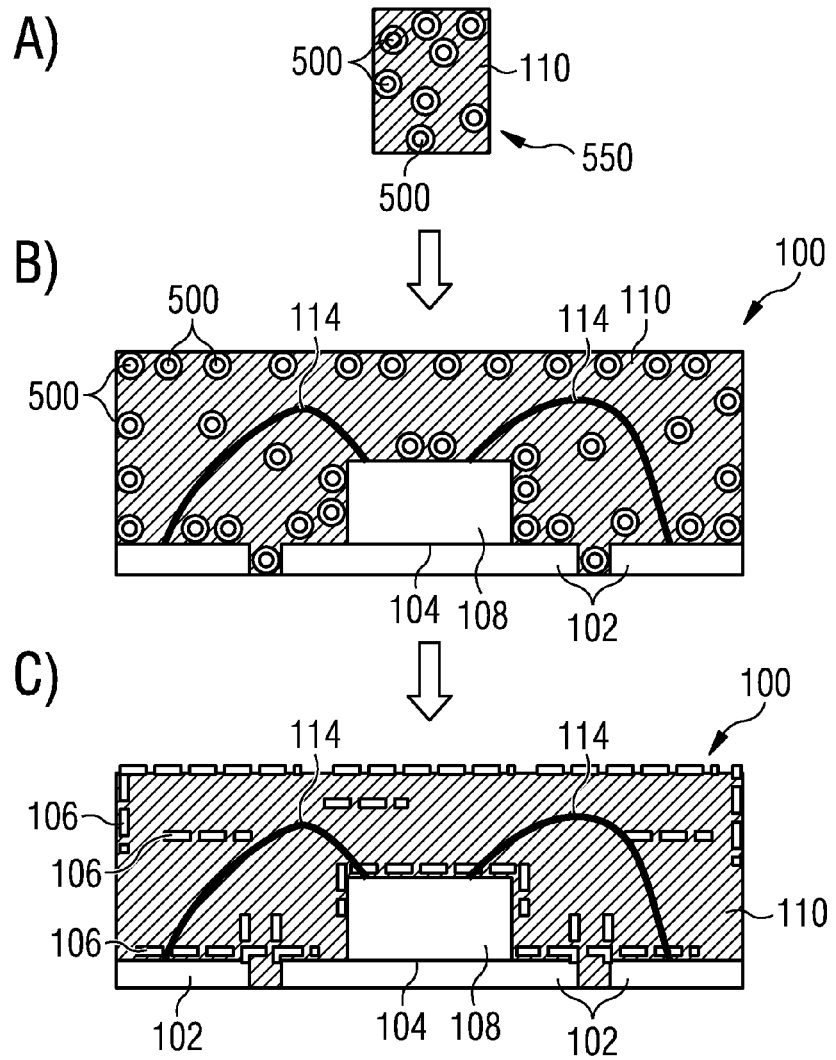
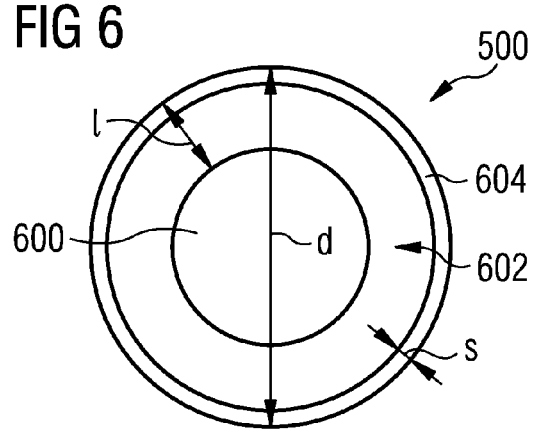

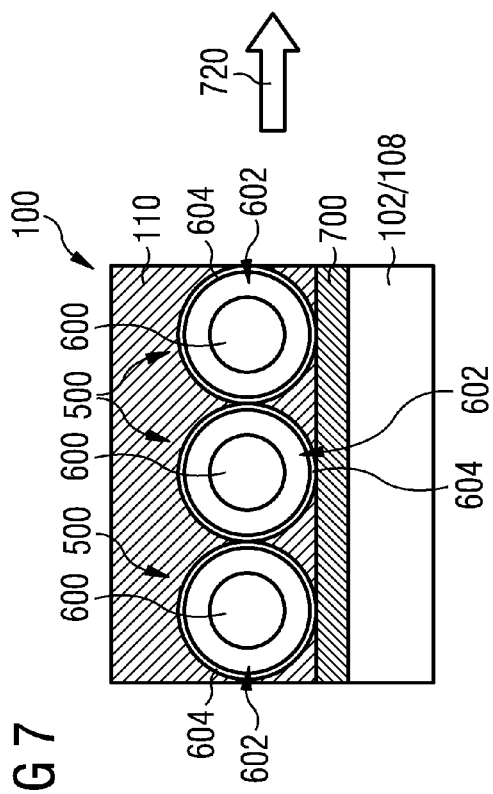
FIG 7
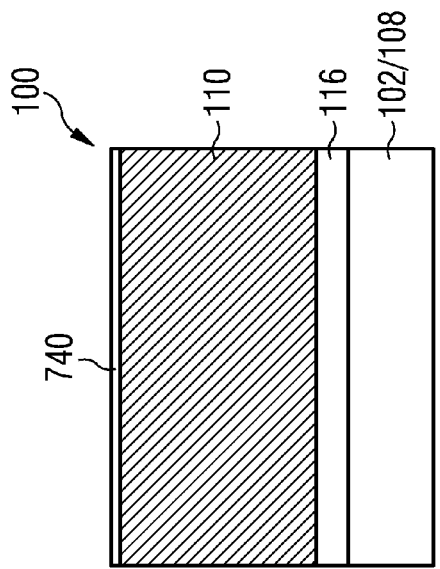
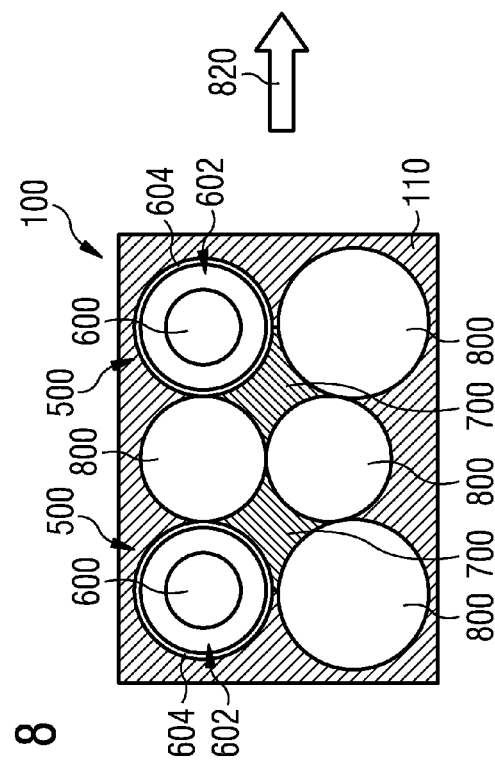
FIG 8
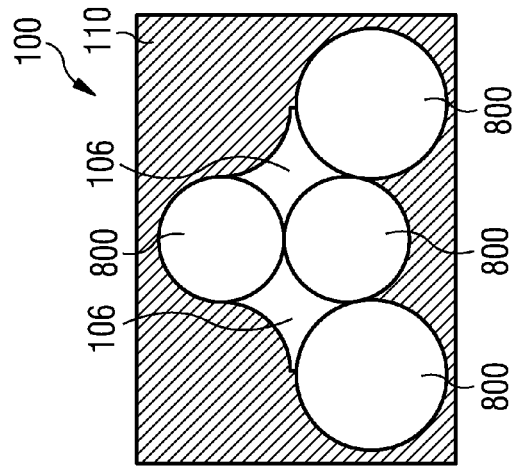

FIG 9
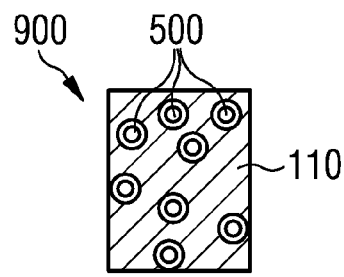
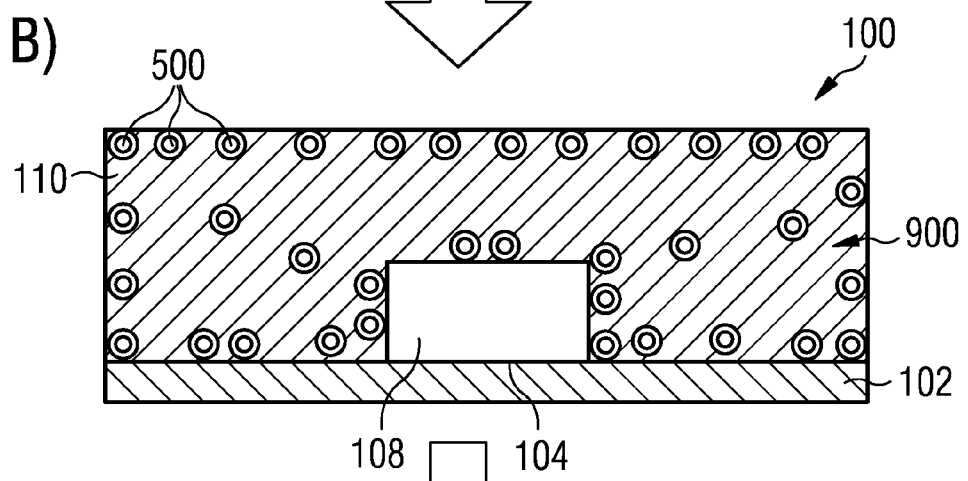
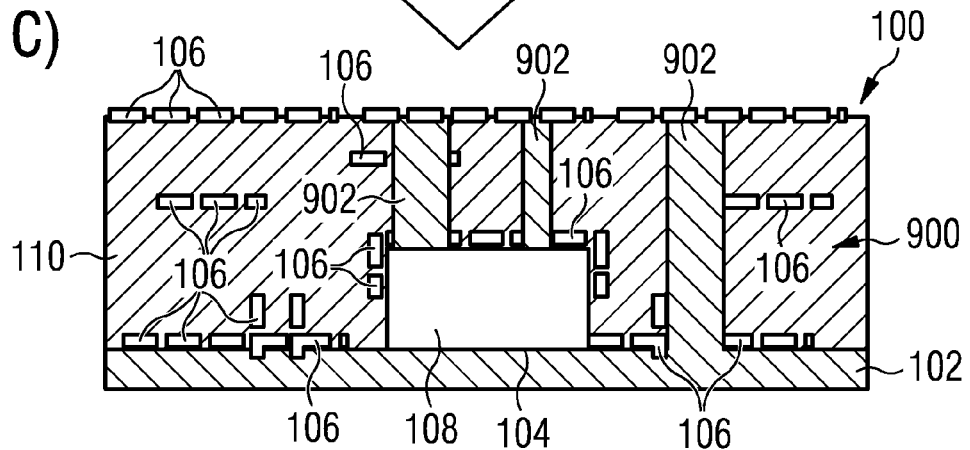

EMBEDDING ADDITIVE PARTICLES IN ENCAPSULANT OF ELECTRONIC DEVICE

BACKGROUND

Technical Field

Various embodiments relate generally to electronic devices, a method of manufacturing an electronic device, a substance, and a method of use.

Description of the Related Art

Packages may be denoted as encapsulated electronic chips with leads extending out of the encapsulation and being mountable to an electronic periphery, for instance on a printed circuit board.

However, there is still potentially room to improve package robustness while maintaining manufacturability simple.

SUMMARY

There may be a need to provide a possibility to manufacture electronic devices which are robust and can be manufactured with reasonable effort.

According to an exemplary embodiment, an electronic device is provided, wherein the device comprises a carrier having a mounting surface, at least one electronic chip mounted on the mounting surface, an encapsulant at least partially encapsulating the carrier and the at least one electronic chip, and a plurality of islands in the encapsulant, the islands comprising an adhesion promoting material.

According to another exemplary embodiment, an electronic device (or a pre-form of an electronic device) is provided, wherein the device comprises a carrier having a mounting surface, at least one electronic chip mounted on the mounting surface, an encapsulant at least partially encapsulating the carrier and the at least one electronic chip, and a plurality of capsules in the encapsulant, wherein each of the capsules comprises a core comprising an additive and comprises a shell enclosing the core.

According to yet another exemplary embodiment, a method of manufacturing an electronic device is provided, wherein the method comprises mounting at least one electronic chip on a mounting surface of a carrier, at least partially encapsulating the carrier and the at least one electronic chip by an encapsulant, and embedding a plurality of capsules in the encapsulant, wherein the capsules comprise a core comprising an additive and a shell enclosing the core.

According to yet another exemplary embodiment, a substance for promoting adhesion between encapsulated components of an electronic device is provided, wherein the substance comprises a plurality of capsules embeddable in an encapsulant of the electronic device, wherein the capsules comprise a core and a shell enclosing the core, wherein the core comprises an adhesion promoting material, and wherein the shell is configured to be crackable (or breakable) in response to an external impact (in particular having a strength exceeding a predefined threshold value to thereby trigger cracking or breaking of the shell).

According to yet another exemplary embodiment, a substance for adjusting conditions (such as physical and/or chemical conditions, for instance adhesion properties and/or hardness) in an encapsulant encapsulating components of an electronic device is provided, wherein the substance comprises a plurality of capsules embeddable in an encapsulant of the electronic device, wherein the capsules comprise a core and a shell enclosing the core, wherein the core comprises an additive capable of adjusting the conditions in the encapsulant, and wherein the shell is configured to be crackable in response to an external impact.

According to yet another exemplary embodiment, a method of using a substance having the above mentioned features—wherein the additive comprises an adhesion promoting material—for promoting adhesion between encapsulated components of an electronic device is provided, wherein the method comprises embedding the substance in the encapsulant, and generating an external impact cracking the shells of the substance in the encapsulant to thereby release the adhesion promoting material for interaction with the encapsulated components.

An exemplary embodiment has the advantage that capsules accommodating an additive (such as an adhesion promoter) for promoting desired characteristics, properties or conditions of an electronic device can be integrated or embedded into an encapsulant. Such a capsule may have a core including the additive and a crackable shell protecting the additive from being released before a user defined activation of the cracking occurs. Such a cracking may be definable and reproducible procedure destroying the shell enclosing the additive. After cracking the shell, the additive of the core may form islands within the encapsulant. This allows to precisely define intrinsic properties of the electronic device, in particular to enhance robustness of the electronic device (such as a package). More particularly, delamination between components of the electronic device may be efficiently suppressed when the additive is an adhesion promoter. Furthermore, undesired gaps (such as air gaps) in an interior of the electronic device may be filled with the material of the capsules/islands, thereby improving the mechanical properties of the electronic device.

DESCRIPTION OF FURTHER EXEMPLARY EMBODIMENTS

In the following, further exemplary embodiments of the methods, the devices and the substance will be explained.

In an embodiment, the shell is crackable or destroyable, i.e. can be cracked in particular under the influence of heat and/or ultrasound and/or mechanical pressure, to thereby discharge or release the core material to its intra-package environment for activating an interaction between the core material and the environment. Activation of the function of the additive in an interior of the electronic device may therefore be precisely triggered by a user by initiating the cracking procedure. Although being located within the encapsulant, the activation of the additive release may be precisely controlled by a user.

In an embodiment, a volumetric content of the islands (in particular a density of the numbers of islands per volume of encapsulant) is higher at an interface between the encapsulant and at least one of the carrier and the at least one electronic chip compared with a volumetric content of the islands in an interior of the encapsulant (for instance averaged over the whole volume of the encapsulant). Therefore, the function of the adhesion promoting material or other additive material of the islands may occur precisely at the interfaces as potentially mechanical weak points within the device. For this purpose, it is possible to adjust the chemical properties of the capsules so as to mechanically trigger accumulation or concentration of the capsules at desired locations of the electronic device.

In an embodiment, the encapsulant is a mold compound in which the islands are embedded. In particular, the islands may be embedded in the encapsulant at least partially without direct contact to one another. Such a mold compound may be formed based on mold pellets, particles or granulate. The islands (or capsules as a pre-form thereof) may be embedded in a matrix of mold material (for instance plastic material). Hence, the capsules may be located within the mold pellets before an encapsulation procedure. In an embodiment, the plurality of capsules may be embedded in the encapsulant by a mold flow.

In another embodiment, the encapsulant is a laminate of a stack of foils in and/or between which the islands are embedded. In particular, the islands may be arranged as at least one layer between adjacent foils. In such an embodiment, capsules may be arranged in and/or between foils or layers or other structures of the laminate type encapsulant. This already allows a provision of the capsules at desired, for instance mechanically critical, locations within the electronic device. In such an embodiment, the method may further comprise cracking the capsules by pressing the foil(s) and/or laminate(s), between which foils the capsules are embedded. Hence, the pressing procedure will trigger the release of the additive.

Hence, the encapsulant may comprise a laminate and/or a foil or a mixture of laminate and foil. In and/or between laminate(s)/foil(s), the islands/capsules may be embedded, in particular arranged as one or more interface layers or structures at laminate(s)/foil(s).

For instance, the capsules may have a spherical or substantially spherical shape.

In an embodiment, the number of capsules or islands in the encapsulant may be larger than ten, in particular larger than one hundred, more particularly larger than one thousand.

In an embodiment, at least part of the capsules or islands have a dimension in at least one spatial direction in a range between 100 nm and 200 µm, in particular in a range between 1 µm and 50 µm, more particularly in a range between 5 µm and 20 µm. When having a dimension in an order of magnitude of micrometers, the islands or capsules may be denoted as microislands or microcapsules. In the described ranges, the dimension of the islands or capsules is small enough to avoid macroscopic inclusions in the electronic device which might deteriorate the device function. At the same time, the indicated ranges of dimensions are large enough so as to be capable of efficiently locally influencing the properties in an interior of the electronic device, in particular to locally promote adhesion at mechanically weak point interfaces.

In an embodiment, the device further comprises an adhesive structure, for instance at least one of glue and solder, between the carrier and the at least one electronic chip. For example, the glue may be an epoxy glue. For instance, the solder may comprise a metal or an alloy. An interface between the described adhesive structure, the carrier and the electronic chip is a potentially critical position within a package or electronic device in terms of delamination or mechanical instability. By providing the capsules/islands at or close to such interfaces, mechanical robustness can be strengthened there.

In an embodiment, the device further comprises at least one wire bond electrically connecting the at least one electronic chip to the carrier. The connection positions between such wire bonds and chip/carrier is a further potential weak point in terms of mechanical stability. Thus, mechanical robustness of the electronic device may be strengthened by arranging capsules/islands at or close to such connection regions.

In an embodiment, the device further comprises at least one film of adhesion promoting material at an interface between the encapsulant and at least one of the carrier and the at least one electronic chip. Such a film may be formed by a layer of capsules which are specifically located close to the described interface where conventional packages may tend to delamination. The capsule layer may be activated (for instance by heat) and will then be converted into the film (which may be a layer or also a number of interconnected islands).

In an embodiment, at least some of the islands are unconnected to other islands. Therefore, the islands may be spaced with regard to one another in particular by material of the encapsulant.

In an embodiment, at least some of the islands are connected to other islands. Therefore, at least some of the islands may form a consecutive structure. Such a consecutive structure may be a planar layer or a disordered three-dimensional structure.

In an embodiment, a volumetric content of the capsules is higher at an interface between the encapsulant and at least one of the carrier and the at least one electronic chip compared with an interior of the encapsulant. This can for instance be accomplished by configuring the capsules with an hydrophobic exterior surface, thereby promoting accumulation of the capsules in the interface sections.

In an embodiment, a ratio between a volume of the capsules or islands on the one hand and the volume of the encapsulant material on the other hand may be less than 10%, in particular in a range between 1% and 10%. Therefore, already very small amounts of capsule/islands material may be sufficient to achieve the desired result of an improved mechanical robustness of the package or electronic device. This in particular holds when the capsules/islands are accumulated at critical mechanical positions, in particular at interfaces between different materials.

In an embodiment, the capsules are configured to be crackable by applying an external impact with a value (for instance a temperature value), strength (for instance mechanical pressure) or intensity (for instance of ultrasound) above a respective threshold value. In other words, cracking may then be inhibited while the threshold value has not been reached or exceeded. Thus, precise control of the activation of the additive may be achieved.

In an embodiment, the capsules are configured to be crackable by applying at least one of thermal energy, pressure, and ultrasound. For instance, the capsules may be configured so that the shells crack or break only upon exceeding a threshold temperature. Additionally or alternatively, the capsules may be configured so that the shells crack or break only upon exceeding a threshold intensity of the ultrasonic sound waves. Further additionally or alternatively, the capsules may be configured so that the shells crack or break only upon exceeding a threshold pressure value or mechanical load. The described mechanisms all allow to precisely control an activation of the release of additives out of the capsules.

In an embodiment, the shells have a hydrophobic external surface. In the context of the present application, the term "hydrophobic" may particularly denote a physical property of the external surfaces of the capsules that they are repelled from water. Externally hydrophobic capsules may be non-polar and may prefer other neutral molecules and non-polar matter. Examples of hydrophobic molecules include alkanes, oils, and lipids which may form the exterior surface of the capsules. When the external surface of the shells has hydrophobic character, this has the significant advantage that, in view of the chemical behaviour of the externally hydrophobic capsules, the capsules tend to accumulate at interfaces between materials where, without the additive provided by the capsules, mechanical instability such as danger of delamination would be likely to occur. Thus, with externally hydrophobic capsules, the amount of additive required in an encapsulant and hence the disturbance of the electronic device can be kept very small.

In particular, the hydrophobic exterior surface of the capsules may be formed by a monolayer (for instance a graphene monolayer) so that the capsules may be provided with the desired external chemical behaviour without significantly increasing the size of capsules and hence electronic device.

In an embodiment, the shells comprise a polylactic acid (PLA) coated with graphene oxide and/or a thermoplastic polymer. Although other materials than PLA are possible for the shells, PLA tends to be mechanically stable in the absence of excessive heat and excessive ultrasound and excessive pressure. In the presence of significant heat and/or significant ultrasound however, PLA will be reproducibly cracked or destroyed to thereby release the additive in its interior. The shells may therefore act as an externally controllable predetermined breaking point for releasing additive within the encapsulant.

In an embodiment, the additive comprises at least one of the group consisting of an adhesion promoter (in particular coated on filler particles such as a silica filler), a thermoplastic resin, a catalyst, a stress relieve agent, a rubber, a hydrophobic material, and a hardener. For instance, 3-Isocyanatepropyltriethoxysilane, N-2-(Aminoethyl)-3-aminopropyltrimethoxysilane may be used as an adhesion promoter. Although the use of an adhesion promoter as additive is preferred, it is additionally or alternatively also possible to use other kind of additives for the islands and/or the capsules, for instance to further increase robustness of the electronic device, improve its dielectric properties, etc.

Additives with hydrophobic properties may be provided for the purpose to reduce moisture absorption on the surface (for example Teflon, Polytetrafluoroethylene). Additives may also be provided to, improve heat removal properties, etc. For instance, organophosphine, imidazole may be used as a catalyst.

In an embodiment, the additive comprises a thermoplastic material becoming flowable upon application of thermal energy. Correspondingly, also the islands may be made of a thermoplastic material. Such additives with thermoplastic characteristic will flow after applying heat again, so that this material characteristic allows gaps to be filled with the reflowing thermoplastic material.

In an embodiment, the electronic device may be configured as a flip chip package. In particular, such a flip chip package may have an interconnection of the electronic chip(s) to external circuitry with solder bumps that have been deposited onto the chip pads. Other configurations of electronic devices in flip chip technology having the above-mentioned islands and/or capsules are however possible as well.

In an embodiment, the method further comprises cracking the capsules by applying at least one of thermal energy, pressure, and ultrasound to thereby bring the additive in direct interaction with at least one of the encapsulant, the carrier, the at least one electronic chip, and an interconnecting system such as a bond wire. Hence, the capsules may first be moved towards desired locations within the electronic device (for instance as a consequence of their external surface properties according to which they may be forced towards certain material interfaces while having a lower tendency to accumulate at or in other materials) and may be subsequently triggered to release their additive (such as adhesion promoter) in particular by excessive supply of energy. By taking this measure, islands may be formed constituted of material (in particular core material) flowing out of the capsules.

In an embodiment, the method further comprises cracking the capsules by (i.e. during and triggered by) carrying out a reflow soldering procedure. When carrying out the reflow soldering procedure, the (for instance beforehand liquid, semiliquid or viscous) material of the encapsulation may be already fully cured or may be already fully solid. When cracking during reflow soldering, no extra procedure of cracking is necessary rendering the method highly efficient and fast. Even when a separate cracking procedure has already been carried out when starting with the reflow soldering, potentially remaining capsules which have not yet been cracked in the cracking procedure may be cracked during the reflow soldering procedure, thereby increasing the cracking efficiency up to a value of for instance very close to 100%.

In an embodiment, the cracking is carried out prior to a post encapsulating curing procedure. For example, the capsules may be cracked while the material of the encapsulant is still in a flowable, vicious, liquid or semi-solid (i.e. not yet fully cured) phase state. In particular under such conditions, the additive in the capsules is still somewhat flowable within the not yet fully solid encapsulant, thereby allowing diffusion of additive material to desired interface locations in an interior of the electronic device.

In an embodiment, the method further comprises accumulating the capsules around at least one of the group consisting of the at least one electronic chip, the carrier, a bond wire, and an adhesive structure. Particularly interfaces between the mentioned components of the electronic device are conventionally prone to delamination, formation of undesired air gaps and mechanical instability, and can be rendered significantly more stable by the supply of capsules/islands with the described properties. By such an intentional accumulation of capsules specifically in critical volumes of the encapsulant while depleting less critical volumes of the encapsulant from capsules, the capsules may be efficiently used.

In an embodiment, the encapsulant may be an electrically insulating material or dielectric material. For instance, such an encapsulant may be a mold compound or a silicone casting or a polyimide-based spray coating or a sheet stack based laminate. The encapsulant may be made of a thermosetting material or a thermoplastic material. The encapsulant may be formed by transfer molding, injection molding, etc. The encapsulant may also be a laminate or a foil sequence (for instance of a polymer material). For the packaging, moulding or encapsulation, a plastic material or a ceramic material may be used.

In an embodiment, the carrier may be or may comprise a leadframe. In another embodiment, the carrier comprises an electrically insulating (and preferably thermally conductive) structure and an electrically conductive structure thereon and/or therein. In particular, the carrier may be configured as one of the group consisting of a Direct Copper Bonding (DCB) substrate, and a Direct Aluminum Bonding (DAB) substrate.

The one or more electronic chips may be semiconductor chips, in particular dies. In an embodiment, the at least one electronic chip is configured as a power semiconductor chip, in particular comprising at least one of the group consisting of a diode, and a transistor, more particularly an insulated gate bipolar transistor. Correspondingly, the device may be configured as a power module. For instance, the one or more electronic chips may be used as semiconductor chips for power applications for instance in the automotive field.

However, it is also possible to embed other kinds of electronic chips in the encapsulant, such as logic chips, storage devices or the like. In an embodiment, at least one electronic chip may be a logic IC or an electronic chip for RF power applications. Each of the chips may comprise a microprocessor, a microelectromechanical system (MEMS), a sensor (for example a pressure sensor or acceleration sensor), etc.

As substrate or wafer for the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 4 shows a flowchart illustrating a method of manufacturing an electronic device in accordance with a semiconductor package process flow according to an exemplary embodiment.

FIG. 5 shows a mechanism of delivering microcapsules into a mold-type encapsulation of an electronic device according to an exemplary embodiment.

FIG. 6 shows a cross-sectional view of a capsule of a substance for promoting adhesion within an electronic device according to an exemplary embodiment.

FIG. 7 shows a cross-sectional view of an electronic device comprising capsules at an interface between a mold compound type encapsulation on the one hand and a lead frame type carrier or an electronic chip/die on the other hand according to an exemplary embodiment before and after applying ultrasound.

FIG. 8 shows a cross-sectional view of an electronic device comprising capsules within a mold compound type encapsulation mixed with fillers of an electronic device according to an exemplary embodiment before and after applying ultrasound.

FIG. 9 shows a mechanism of delivering microcapsules into a laminate-type encapsulation of an electronic device according to an exemplary embodiment.

DETAILED DESCRIPTION

Figure 1:
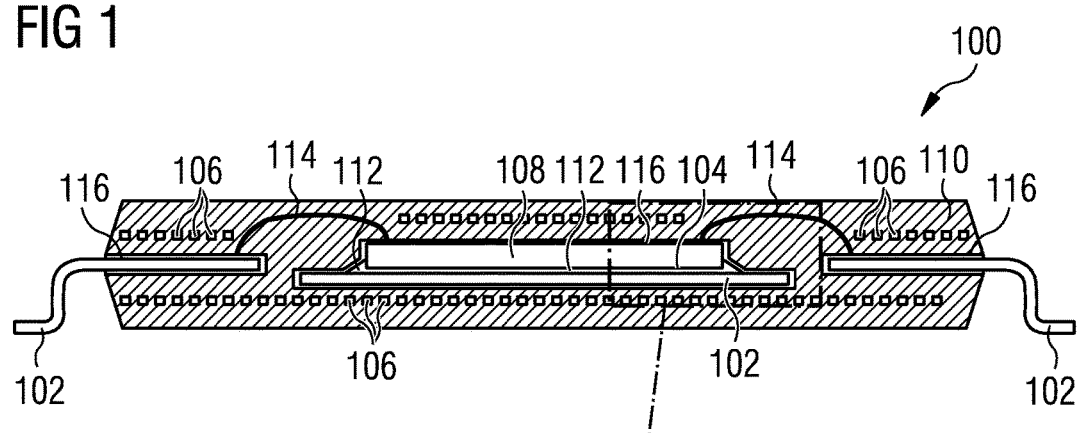
FIG. 1 shows a cross-sectional view of an electronic device according to an exemplary embodiment.

The illustration in the drawing is schematically and not to scale.

Before exemplary embodiments will be described in more detail referring to the figures, some general considerations will be summarized based on which exemplary embodiments have been developed.

An exemplary embodiment relates to a semiconductor packaging technology using a smart seal encapsulation. Providing a delamination inhibitor allows to solve delamination issues in an interior of a package. Potential positions or regions within an electronic device (such as a package) at or in which there is conventionally a risk of delamination are interfaces between encapsulant (for instance mold compound) and electronic chip (for instance die), encapsulant (such as mold compound) and a carrier (such as a leadframe), encapsulant (such as mold compound) and a glue, etc. According to an exemplary embodiment, a significant suppression or even elimination of delamination can be achieved through enhancement of adhesion and stress relief by an adhesion promoter coated silica as an additive provided as islands/capsules in the encapsulant. This may at the end result in a significant enhancement of package robustness.

More particularly, it is possible to achieve improved package robustness via microcapsules containing additives which may be dispersed to particularly one or more of the following areas:

Interfacial surface between mold compound and leadframe
Interfacial surface between die and mold compound
Interfacial surface between glue and mold compound
Interfacial surface between wire and mold compound
Within the mold compound itself Thus, improved package robustness may be obtained via the microcapsules containing additives dispersed to the described and/or other regions within the encapsulant.

Hence, smart microcapsules may be provided which contain additives having the capability or property to disperse well in a mold compound. Furthermore, such capsules may have the property that induced heat and/or ultrasound will break the microcapsules and therefore release the additive to one or more of the interfacial surfaces.

In an advantageous embodiment, the behavior of the microcapsule surface is hydrophobic and therefore will be guided by or with the mold flow to the interfacial surface. Additives may then be released via ultrasonic energy and/or heat. Application of heat may for instance involve heating the electronic device to at least 180° C., for example for a time interval between 15 minutes and 30 minutes. Application of ultrasonic energy may for instance involve a treatment with ultrasound for a time interval between 1 minute and 5 minutes. In an embodiment, temperature-sensitive microcapsules can be cracked during reflow-soldering (for example involving temperatures of 260° C.) to close air gaps in an interior of the electronic device.

The robustness of the semiconductor packages can be enhanced by correspondingly adjusting or modifying the additive composition in the microcapsule without affecting the mold flowability, gel time and mold deflashability. Chemical resistance at material interfaces can be enhanced by increasing curability of resin through a catalyst or a hardener without an increase of the modulus of the bulk compound. Hence, a wide range of high performance additives like adhesion promoter inside microcapsules, etc. can be used without affecting moldability and releasability.

With the microcapsules is possible to significantly reduce the amount of adhesion promoter/encapsulated additive content inside a mold compound. Hence, no highly excessive adhesion promoter is any longer required for side reaction (this conventionally can be accompanied with a negative effect on the composite properties). This is for example important for sulfur based ingredients having a less impact on metal degradation.

In an embodiment, it is possible to advantageously use capsules of the described type not only for a mold compound architecture but as well for lamination sheets (for chip embedding packages). Here, the capsules may be laminated/attached as an own layer or sheet on bottom and/or top of the laminate. Cracking of the capsules may be triggered by mechanical pressure during the lamination process, in particular when accompanied by a sufficiently high temperature (for example above 175° C.)

FIG. 1 shows a cross-sectional view of an electronic device 100 or package according to an exemplary embodiment.

The electronic device 100 is configured as a packaged semiconductor chip device. The electronic device 100 comprises a carrier 102 embodied as a leadframe made of copper material which has a mounting surface 104. An electronic chip 108 (alternatively a plurality of electronic chips 108) which may for instance be configured as a semiconductor power chip is mechanically mounted on the mounting surface 104 via an adhesive structure 112 such as a glue (for instance an electrically conductive glue) or soft solder. By the same connection, one or more bond pads (not shown) at the lower main surface of the electronic chip 108 is/are electrically coupled to the carrier 102. Bond wires 114 electrically connect one or more bond pads (not shown) at the upper main surface of the electronic chip 108 to respective sections of the carrier 102.

An encapsulant 110, which is here configured as a mold compound of plastic material, only partially encapsulates the carrier 102 so that exposed connection portions of the carrier 102 for electrically connecting the electronic device 100 to a periphery device such as a printed circuit board (not shown) extend out of the encapsulant 110. The encapsulant 110 furthermore entirely encapsulates the electronic chip 108, the bond wires 114, the adhesive structure 112 and a plurality of islands 106 in the encapsulant 110.

For instance, the number of islands 106 in the encapsulant may be larger than 10, in particular may be larger than 100, more particularly may be larger than 1000. The islands 106 comprise an adhesion promoting material or any other additive adjusting the properties of the electronic device 100. The islands 106 are embedded within the encapsulant 110 without direct contact to one another, i.e. are spatially separated structures. The for instance bead-shaped islands 106 may have dimensions in a range between 5 μm and 20 μm in all spatial directions.

The electronic device 100 further comprises films 116 at interfaces between the encapsulant 110 on the one hand and the carrier 102 and the electronic chip 108 on the other hand. In the shown embodiment, also the films 116 comprise the adhesion promoting material which also the islands 106 comprise. As can be taken from FIG. 7, the films 116 may be constituted by appropriately treated capsules 500, as will be described below.

Figure 1A:
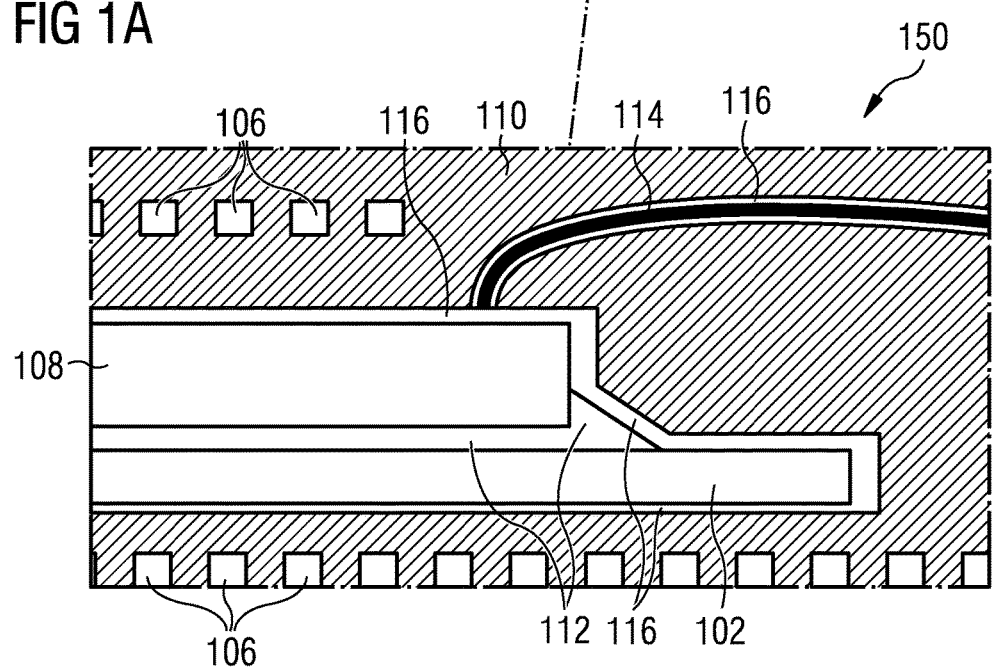
FIG. 1A shows a detail of part of the electronic device of FIG. 1.

Hence, the presence of the adhesion promoting islands 106 within the encapsulant 110 improve the intra-robustness of the encapsulant 110, whereas the presence of the adhesion promoting films 116 improve the inter-robustness between the encapsulant 110 on the one hand and the electronic chip 108, the carrier 102, the adhesive structure 112 and optionally also the bond wires 114 on the other hand. This is visible particularly well in detail 150 shown in FIG. 1A.

Figure 2:
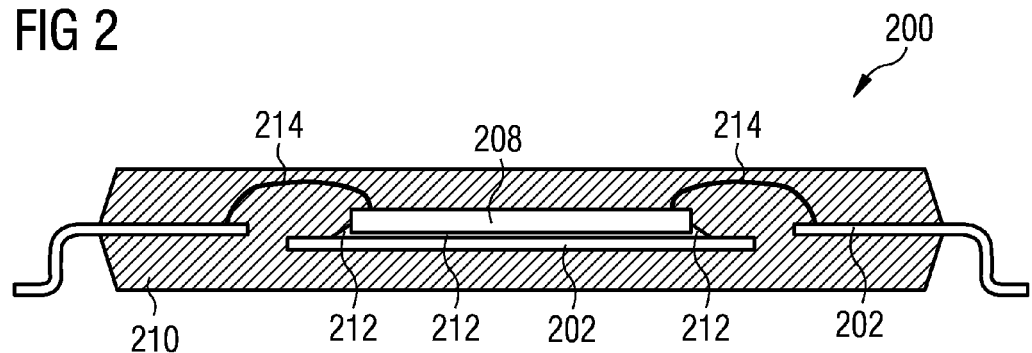
FIG. 2 shows a cross-sectional view of a conventional electronic device.

FIG. 2 shows a cross-sectional view of a conventional electronic device 200. The electronic device 200 has a carrier 202, an adhesive structure 212, an electronic chip 208, an encapsulant 210 and bond wires 214.

Figure 3:
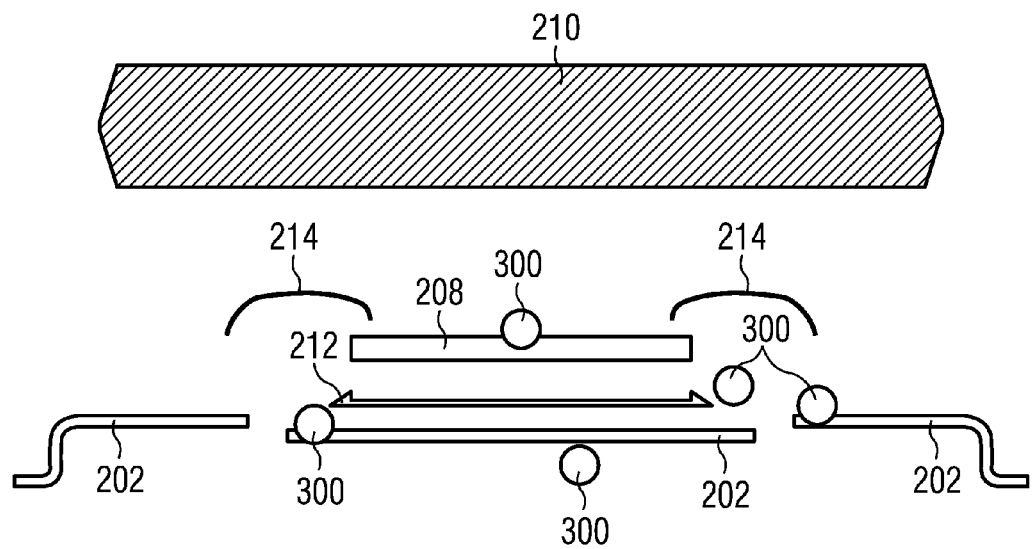
FIG. 3 shows an exploded view of the electronic device of FIG. 2.

FIG. 3 shows an exploded view of the electronic device 200 of FIG. 2. Dots 300 indicate critical positions and interfaces of the package at which conventionally inter-component and/or intra-component delamination or poor adhesion may occur.

According to an exemplary embodiments, the adhesion promoting material of the islands 106 and the films 116 are specifically supplied to one or more of the positions according to the dots 300 indicating interfaces between different materials of the components of the electronic device 200. This significantly increases package robustness according to an exemplary embodiment.

FIG. 4 shows a flowchart 400 illustrating a method of manufacturing an electronic device 100 in accordance with a semiconductor package process flow according to an exemplary embodiment.

In a procedure 402, die bonding is carried out, i.e. the electronic chip 108 is bonded via the adhesive structure 112 at the main surface 104 to the carrier 102.

In a subsequent procedure 404, wirebonding is performed, i.e. bond wires 114 are provided to electrically connect the electronic chip 108 to the carrier 102.

In a further subsequent molding procedure 406, molding is carried out, i.e. the encapsulant 110 embodied as mold compound including capsules (compare description of FIG. 5 to FIG. 8) is formed to partially encapsulate the carrier 102 and to fully encapsulate the adhesive structure 112, the electronic chip 108 and the bond wires 114.

Directly after the molding procedure 406, a capsule shell cracking action is taken, as indicated by reference numeral 408. Thus, the above-mentioned capsules are cracked so that adhesion promoting material is released from the capsules to thereby form in particular islands 106 and/or films 116. The capsule shell cracking action may be embodied by the application of ultrasound and/or by the application of heat.

After the capsule shell cracking action, a post mold curing procedure 410 may be carried out for curing the material of the encapsulant 110. For instance, a previously semi-solid encapsulant 110 may be rendered entirely solid in the post mold curing procedure 410.

When ultrasonic sound and/or heat is applied to the electronic device 100 or its preform for cracking the capsules after molding and before post mold curing, the encapsulant 110 may be in a semi-solid state, i.e. in a state between a liquid state and a solid state. Alternatively, the encapsulant 110 may still be in a liquid state or may already be in a solid state at the time of cracking.

After the post mold curing procedure 410, the electronic device 100 or package is entirely cured.

FIG. 5 shows a mechanism of delivering microscaled capsules 500 into an encapsulation 110 of an electronic device 100 according to an exemplary embodiment. More precisely, FIG. 5 illustrates details of a microcapsule treatment mechanism of a delivery system according to an exemplary embodiment.

As can be taken from an illustration A, the described method of manufacturing the electronic device 100 comprises embedding a plurality of capsules 500 in the encapsulant 110. As shown in the below described FIG. 6, each of the capsules 500 comprise a core 600 comprising an additive and a shell 602 enclosing the core 600. The shells 602 have a hydrophobic external surface 604. The shells 602 comprise a polylactic acid for instance coated with a monolayer of graphene oxide. The additive may comprise or consist of an adhesion promoting material.

As can be taken from illustration A, the capsules 600 are well dispersed in an uncured mold compound pellet 550. In other words, the starting point for encapsulation (in particular molding) may be mold compound pellets 550 which include the capsules 600 in a matrix of encapsulation material (such as a mold compound material), see reference numeral 110. The plurality of capsules 500 may be embedded in the encapsulant 110 in a mold flow.

As can be taken from an illustration B, the method may further comprise mounting the electronic chip 108 on mounting surface 104 of carrier 102, forming bond wires 114, and partially encapsulating the carrier 102 as well as fully encapsulating the electronic chip 108 and the bond wires 114 by the encapsulant 110 including the capsules 500. As can be further taken from illustration B, the method further comprises accumulating or locally concentrating the capsules 500 around material interfaces between the encapsulant 110, the electronic chip 108, the carrier 102, the bond wire 114, and the adhesive structure 112 (not shown in FIG. 5). This can be accomplished by configuring the capsules 500 to have a hydrophobic external surface 604. Illustration B also shows that the distribution of the capsules 500 within the encapsulant 110 is inhomogeneous. As a result of the accumulation, a volumetric portion or density (in terms of number or volume of capsules 500 per volume of encapsulant 110) of the adhesion promoting material in form of the capsules 500 in an interior of the encapsulant 110 is higher at/close to interfaces between the encapsulant 110 on the one hand and the carrier 102 and the electronic chip 108 on the other hand as compared to other regions within the encapsulant 110. Also at exposed surface portions of the encapsulant 110, the volumetric portion of capsules 500 is locally increased.

During transfer molding, the capsules 500 with their hydrophobic surface will be pushed to the surface of the carrier 102, more precisely leadframe surface. They will also be pushed towards the surface of the electronic chip 108, i.e. the die surface and the surface of the encapsulant 110, i.e. the mold surface, due to differences in hydrophobic and hydrophilic character. In other words, because of the hydrophobic character of the exterior surface 604 of the capsules 500, the capsules 500 or at least a more than proportional (or disproportional) part thereof, self-sufficiently move(s) towards the mentioned target interfaces (in particular the interfaces at which conventionally the danger of delamination exists). After molding, a significant portion of the capsules 500 is localized at the leadframe surface, the die surface and the mold compound surface.

As can be taken from illustration C, the method further comprises cracking the capsules 500 by applying thermal energy and/or ultrasound. The capsules 500, more precisely their shells 602, are configured to be crackable by applying thermal energy and/or ultrasound. Forcing the capsules 500 to crack brings the additive of their core 600 in direct interaction with the juxtaposed encapsulant 110, carrier 102 and electronic chip 108. Thus, an ultrasonic activation can be performed to destruct the capsule 500 walls, and heat may be applied to diffuse the additive to the interfacial positions. As a consequence, the adhesion promoting material is released and localized at the mold compound surface and the described interfaces.

As can be taken from illustration C in combination with illustration B, the locally increased volumetric portion or density of the capsules 500 in the encapsulant 110 advantageously translates into a locally increased volumetric portion or density of the islands 106 in the encapsulant 110.

FIG. 6 shows a cross-sectional view of a capsule 500 of a substance for promoting adhesion within an electronic device 100 according to an exemplary embodiment. FIG. 6 therefore shows the detailed structure of the capsules 500 already described referring to FIG. 5.

The capsule wall or shell 602 can be fabricated from PLA coated with graphene oxide or thermoplastic polymer and is therefore configured so that it can be destructed by ultrasonic energy and/or heat.

Hydrophobic surface 604 promotes the automatic motion of the capsules 500 towards their desired destinations, i.e. the mechanical weak points.

Additive for the encapsulation material, such as adhesion promoter coated on silica filler (or additionally or alternatively other additives such as thermoplastic resin, catalyst and/or hardener) is provided by the core 600. Other appropriate additives which may be provided by the core 600 are rubber material, a stress relieve system or substance, a substance with hydrophobic properties, etc.

For example, a thickness, d, of the entire capsule 500 may be in a range between 100 nm and 200 μm, in particular between 5 μm and 20 μm. A thickness, l, of the shell 602 (including hydrophobic external surface 604) may for example be in a range between 30 nm and 4 μm, in particular between 0.5 μm and 1 μm. A thickness, s, of the layer constituting the hydrophobic external surface 604 of the shell 602, may be in the order of magnitude of Angstroms to nanometers. For instance, it may be a monolayer, i.e. a single atomic or molecular layer.

FIG. 7 shows a cross-sectional view of an electronic device 100 comprising capsules 500 at an interface between a mold compound type encapsulation 110 on the one hand and a lead frame type carrier 102 or an electronic chip 108/die on the other hand according to an exemplary embodiment before (left hand side) and after (right-hand side) applying ultrasound. Reference numeral 700 denotes air gaps or a potential delamination area, here configured as an empty layer.

By cracking the capsules 500 by activating an ultrasound source (not shown), as indicated by arrow 720, the air gaps 700 are filled with film 116 formed by material of the cores 600 of the capsules 500. Material of the shells 602 may accumulate elsewhere, for instance on a surface of the encapsulant 110, as can be taken from reference numeral 740.

FIG. 8 shows a cross-sectional view of an electronic device 100 comprising capsules 500 within a mold compound type encapsulation 110 mixed with fillers 760 according to an exemplary embodiment before (left-hand side) and after (right-hand side) applying ultrasound.

Reference numeral 700 again denotes air gaps or a potential delamination area, here configured as empty islands.

By cracking the capsules 500, as indicated by arrow 820, the air gaps 700 are filled with material of the cores 600 of the capsules 500, thereby forming the filled islands 106.

FIG. 9 shows a mechanism of delivering capsules 500 into a laminate-type encapsulation 110 of an electronic device 100 according to an exemplary embodiment. For the sake of brevity, illustrations A, B, and C of FIG. 9 will be only briefly described, and additional reference is made to corresponding illustrations A, B, and C of FIG. 5, respectively.

As can be taken from an illustration A, the described method of manufacturing the electronic device 100 comprises embedding a plurality of capsules 500 (which may be configured according to FIG. 6) in the encapsulant 110. Illustration A shows that the capsules 600 are well dispersed in uncured laminate 900 or foil material.

During a subsequent lamination procedure, the fact that the capsules 500 have a hydrophobic exterior surface forces the capsules 500 to be pushed to a surface of a carrier 102 such as a lead frame surface.

As can be taken from an illustration B, the capsules 500 are, after lamination, predominantly localized at the surface of the carrier 102, as the surface of the electronic chip 108, and at the exterior surface of the laminate 900 or foil. This happens due to the hydrophobic property of the exterior surface of the capsules 500, or in other words in view of differences in hydrophobic and hydrophilic character of the various materials shown in illustration B.

Subsequently, ultrasonic activation will destruct the microcapsule walls (i.e. shells 602 of the capsules 500), and heat may be added. This also promotes diffusion of additive material of the cores 600 of the capsules 500 to the various material interfaces of the electronic device 100 shown in FIG. 9.

As can be taken from illustration C, the additive (preferably configured as adhesion promoter) of the cores 600 of the capsules 500 is released and forms adhesion promoting islands 106 which are localized predominantly at the surfaces and the interfaces of the laminate type encapsulant 110 to thereby specifically improve adhesion in these conventionally critical regions.

As electric interconnection system, the electronic device 100 according to FIG. 9 uses vertically extending electrically conductive posts 902 rather than bond wires 114. The electrically conductive posts 902 are connected to the electronic chip 108 and the carrier 102.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic device, the device comprising:
   a carrier having a mounting surface;
   at least one electronic chip mounted on the mounting surface;
   an encapsulant at least partially encapsulating the carrier and the at least one electronic chip;
   a plurality of islands dispersed in an interior of the encapsulant, wherein the islands are formed by an adhesion promoting material contained within cores of a plurality of capsules included within the encapsulant, each core comprising a shell that is crackable in response to an external impact while remaining in the encapsulant, the islands comprising the adhesion promoting material, wherein at least part of the islands has a dimension in at least one spatial direction in a range between 100 nm and 200 μm.

2. The device according to claim 1, wherein a volumetric content of the islands is higher at an interface between the encapsulant and at least one of the carrier and the at least one electronic chip compared with an interior of the encapsulant.

3. The device according to claim 1, wherein the encapsulant is a mold compound in which the islands are embedded, in particular at least partially without direct contact to one another.

4. The device according to claim 1, wherein the encapsulant is one of the group consisting of at least one laminate, at least one foil, and a mixture of at least one laminate and at least one foil, in and/or between which the islands are embedded, in particular arranged as at least one interface layer at the laminate and/or the foil.

5. The device according to claim 1, wherein at least part of the islands has a dimension in at least one spatial direction in a range between 1 μm and 50 μm, particularly in a range between 5 μm and 20 μm.

6. The device according to claim 1, further comprising at least one film of adhesion promoting material at an interface between the encapsulant and at least one of the carrier and the at least one electronic chip.

7. An electronic device, the device comprising:
   a carrier having a mounting surface;
   at least one electronic chip mounted on the mounting surface;
   an encapsulant at least partially encapsulating the carrier and the at least one electronic chip;
   a plurality of capsules dispersed in an interior of the encapsulant, wherein the capsules comprise a core comprising an additive and comprise a shell, in particular a crackable shell, enclosing the core, wherein the shell is configured to be crackable in response to an external impact while remaining in the encapsulant.

8. The device according to claim 7, wherein a volumetric content of the capsules is higher at an interface between the encapsulant and at least one of the carrier and the at least one electronic chip compared with an interior of the encapsulant.

9. The device according to claim 7, wherein the capsules are configured to be crackable by applying at least one of thermal energy, mechanical pressure, and ultrasound.

10. The device according to claim 7, wherein the shells have a hydrophobic external surface.

11. The device according to claim 7, wherein at least part of the capsules have a dimension in at least one spatial direction in a range between 100 nm and 200 μm, in particular in a range between 1 μm and 50 μm, more particularly in a range between 5 μm and 20 μm.

12. The device according to claim 7, wherein the shells comprise a polylactic acid coated with one or both of the group consisting of graphene oxide, and a thermoplastic polymer as external surface.

13. The device according to claim 7, wherein the additive comprises one of the group consisting of an adhesion promoter, in particular an adhesion promoter coated on a silica filler, a thermoplastic resin, a catalyst, a hardener, a rubber, a stress relieve agent, and hydrophobic material.

14. The device according to claim 7, wherein the additive comprises a thermoplastic material becoming flowable upon application of thermal energy.

15. The device according to claim 1, configured as a flip chip package.

16. A method of manufacturing an electronic device, the method comprising:
   mounting at least one electronic chip on a mounting surface of a carrier;
   at least partially encapsulating the carrier and the at least one electronic chip by an encapsulant;
   embedding and dispersing a plurality of capsules in an interior of the encapsulant, wherein the capsules comprise a core comprising an additive and comprise a shell, in particular a crackable shell, enclosing the core, wherein the shell is configured to be crackable in response to an external impact while remaining in the encapsulant.

17. The method according to claim 16, wherein the method comprises cracking the capsules by applying at least one of thermal energy, mechanical pressure, and ultrasound to thereby bring the additive in direct interaction with at least one of the encapsulant, the carrier, the at least one electronic chip, and an interconnecting system such as a bond wire.

18. The method according to claim 16, wherein the method comprises cracking the capsules by pressing at least one foil or laminate of a laminate type encapsulant, wherein the capsules are embedded between the foils.

19. The method according to claim 16, wherein the method comprises embedding the plurality of capsules in the encapsulant by a mold flow.

20. The method according to claim 16, further comprising accumulating the capsules around at least one of the group consisting of the at least one electronic chip, the carrier, a bond wire, and an adhesive structure.

21. A substance for adjusting conditions in an encapsulant encapsulating components of an electronic device, wherein the substance comprises:
   a plurality of capsules embeddable and dispersible in an interior of an encapsulant of the electronic device;
   wherein the capsules comprise a core and a shell enclosing the core;
   wherein the core comprises an additive capable of adjusting the conditions in the encapsulant;
   wherein the shell is configured to be crackable in response to an external impact while remaining in the encapsulant.

22. A method of using a substance according to claim 21, wherein the additive comprises an adhesion promoting material, for promoting adhesion between encapsulated components of an electronic device, wherein the method comprises:
   embedding the substance in the encapsulant;
   generating an external impact cracking the shells of the substance in the encapsulant to thereby release the adhesion promoting material for interaction with the encapsulated.

* * * * *